United States Patent
Feraud et al.

(10) Patent No.: US 6,239,985 B1
(45) Date of Patent: May 29, 2001

(54) HIGH SPEED SIGNALS DISTRIBUTION FOR BACKPLANES

(75) Inventors: Jacques Feraud; Michel Verhaeghe, both of Vence (FR)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 09/385,949

(22) Filed: Aug. 30, 1999

(30) Foreign Application Priority Data

Oct. 8, 1998 (EP) .................................................. 98480067

(51) Int. Cl.⁷ ............................... H05K 1/14; H05K 7/20
(52) U.S. Cl. ............................................. 361/788; 333/100
(58) Field of Search .............................. 361/788; 333/100

(56) References Cited

U.S. PATENT DOCUMENTS

| | | | |
|---|---|---|---|
| 5,119,273 | * 6/1992 | Corda | 361/413 |
| 5,319,526 | * 6/1994 | Takashima | 361/788 |
| 5,548,734 | 8/1996 | Kolinski et al. | 395/306 |
| 5,696,667 | 12/1997 | Berding | 361/788 |
| 5,930,119 | * 7/1999 | Berding | 361/788 |

\* cited by examiner

*Primary Examiner*—Benny Lee
*Assistant Examiner*—Stephen E. Jones
(74) *Attorney, Agent, or Firm*—Daniel E. McConnell

(57) ABSTRACT

A method and apparatus for distribution of electrical signals in a circuit board. Specifically, the circuit board comprises a printed circuit board and a plurality of connectors attached to the circuit board for receiving components such as logic cards which each require a clock input. Each of the connectors may have a plurality of pins. A plurality of electrical conductors associated with the circuit board electrically couple a corresponding pin for a clock input from each connector to a common point by individual one of the plurality of electrical conductors. Each of the plurality of electrical conductors are so arranged that to have approximately the same length.

3 Claims, 2 Drawing Sheets

HIGH SPEED SIGNALS DISTRIBUTION FOR BACKPLANES

TECHNICAL FIELD

The invention relates to distribution of signals in a circuit board and more particularly to backplanes and mother boards having a multi-point electrical topology and distribute high speed signals such as clock signals.

BACKGROUND ART

Circuit boards in the form of backplanes and mother boards provide the backbones that drive most computer systems. They generally exist in the form of printed circuit boards (PCB) containing various logic, memory, or microprocessor devices and interface mechanisms, frequently plugged into connectors or receiving slots into which additional cards containing such components can be plugged. The actual PCB manufacturing techniques have improved, making features smaller and allowing larger PCB with increasing numbers of components capable of performing at ever-increasing speeds to be mounted on today's circuit boards. Thus, many backplanes and motherboards used in large computers and control equipment now feature PCB's with many components with extremely fine land (wires) or electrical conductors widths interconnecting them.

One major problem in such PCBs involves the difficulty in delivering a synchronized high speed signal (such as clocks in the order of several tens of megahertz) to cards and modules which can be mounted anywhere on the backplane. In addition, backplanes may be either fully populated with cards and other components or have any combination of full or empty receiving slots which create variable capacitance load. Moreover, no predetermined slot is assigned to a card delivering a clock signal and the backplane must provide reliable transmission characteristics whatever the configuration of the circuit board and its slots may be (i.e., whether the slots are populated or not and wherever the clock is located).

U.S. Pat. No. 5,696,667 issued to Berding discloses a data processing system that includes a backplane with logic boards connected to the backplane by a plurality of connectors. A set of common points is electrically coupled to the connectors by individual conductive traces between each common point and the corresponding pins of the connectors. The common points are preferably centrally located among the plurality of connectors to reduce propagation delay. In one embodiment, the electrical conductors to the connectors nearest the common points have a minimum length greater than the distance between the nearest connectors and the common points. While this solution addresses some of the problems, however several drawbacks still result. A first one is that the position of the card delivering the clock signal (also called driver card), is restricted to specific slots locations, with some locations being identified as "worst case" positions in term of signal quality. Such limitation is not acceptable from a design perspective, since designers prefer a system free of any plug-in constraint.

Another drawback with the existing solutions is the inability to correctly simulate or predict the propagation of a signal particularly to evaluate the lines reflections in all possible backplane configurations. In fact, it has been shown that for a given receiver card located at a distance 'Dn' from a common point, the reflections due to the unterminated lines cause the signal at the input of the receiver card to be dependent of the presence (capacitively loaded transmission lines) or the absence (open transmission lines) of other receiver cards and also to be dependent of the distance 'Dn'. According to the prior art solution, it has been computed that a 17 slots backplane leads to about several hundreds of thousands configurations combining both the distance 'Dn' and the presence/absence of other cards.

Consequently, another drawback of the prior art solution is the inability to completely eliminate the reflections caused by the multiple unterminated transmission lines, either open or capacitively loaded. As stated by Berding in the aforementioned patent, the commercially available drives are unable to be terminated by parallel resistors in the range of variable transmission line impedance. Nevertheless, it is known to connect series-resistors either close to the common point or close to the driver component to decrease the amount of reflections. The resistor value is generally adjusted to fit all machine configurations from the lightly loaded one (with only a few cards) to the fully loaded one (one with cards in substantially all the slots).

Accordingly, it would be desirable to be able to provide a new backplane which eliminates the aforementioned problems.

SUMMARY OF THE INVENTION

It is therefore an object of this invention to provide a circuit board or backplane for achieving a reliable high speed signal distribution.

The present invention provides a circuit board or backplane having a distribution of transmission lines arranged in a logical circular topology. Specifically, the backplane comprises a printed circuit board and a plurality of connectors attached to the backplane for receiving logic cards. Each of the connectors may have a plurality of pins, with one corresponding to the clock. A corresponding pin from each connector is electrically coupled by a separate electrical conductor (i.e., a wire) to a common point by individual wire. The electrical conductors are so arranged that each of the plurality of conductors have substantially the same length.

In a preferred embodiment, the common point is located approximately in the middle of the circuit board or backplane, while the plurality of connectors are linearly located symmetrically to the common point.

In addition, each of the plurality of electrical conductors is arranged in a u-shape. The length of the base of each u-shaped conductor is proportional to the distance between the common point and the connected pin of the corresponding connector.

DETAILED DESCRIPTION OF THE INVENTION

Figure 1:
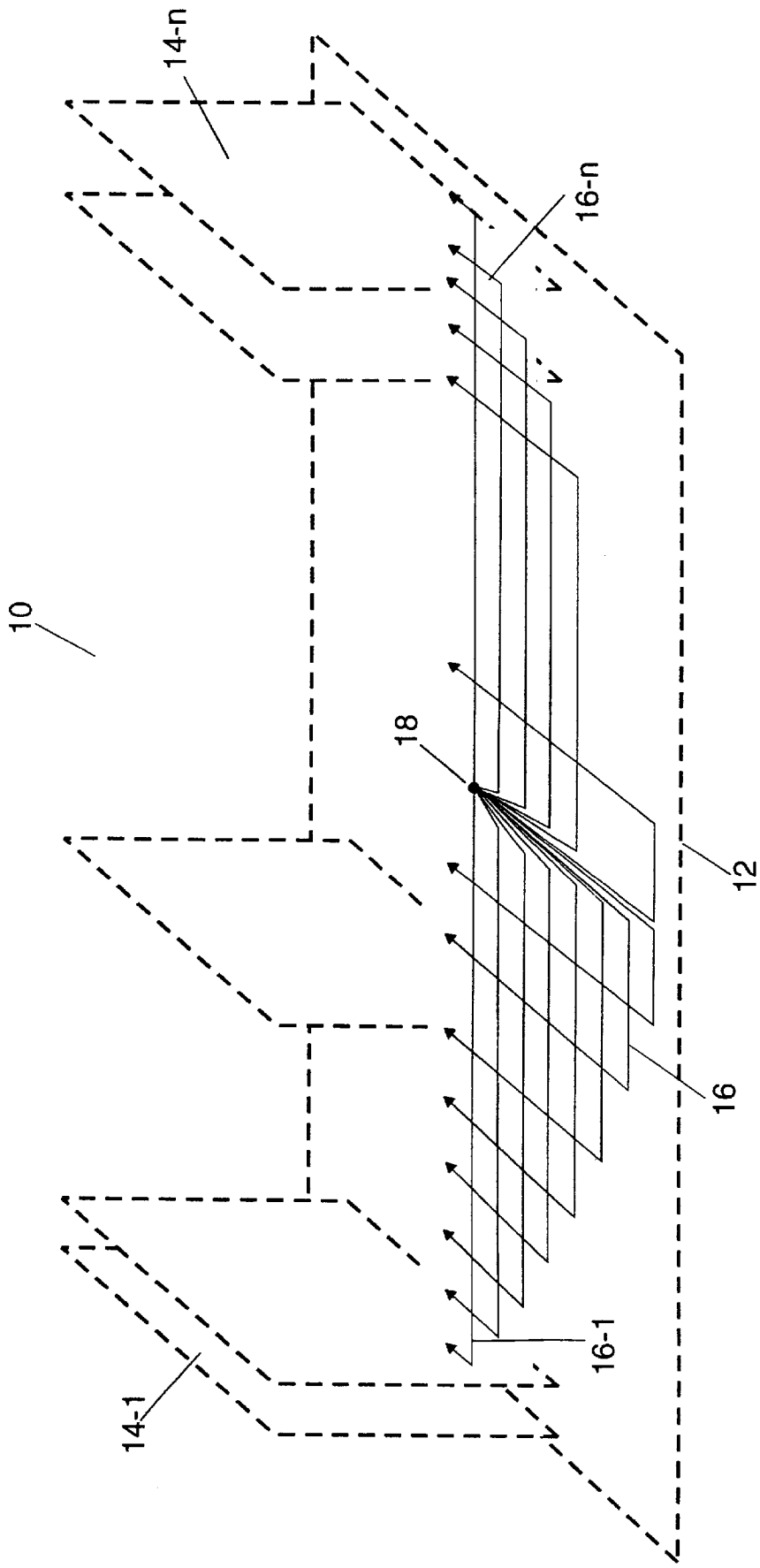
FIG. 1 depicts schematically a backplane assembly in accordance with the present invention.

Referring now to the drawings, FIG. 1 depicts a circuit board (also referred to as a backplane assembly or motherboard) 10 with a preferred embodiment of the present invention. Backplane assembly 10 includes a backplane 12 on which are mounted additional printed circuit boards (not shown), logic cards (14-1 to 14-n) and electrical conductors 16. Preferably the backplane is linear which means that the slots receiving the logic cards are arranged generally parallel with each other, but other backplanes such as cylindrical backplanes could be used. Circuit boards include a plurality of electrical connectors that allow logic cards to be plugged in. It should be recognized that these connectors may be of any dimensions, depth or size suitable for handling plug-in cards, either monolithic or built with several elementary units, although the connectors are usually each of an industry-standard size an shape.

Also shown in FIG. 1 are logic cards (14-1 to 14-n) which are mounted in a plane perpendicular to the backplane. The backplane may include as many logic cards as the number of connectors or may be populated with fewer logic cards. It is one important feature of the invention that the electrical characteristics of the electrical conductors should not be a function of the number of plugged cards.

Depending on the design requirements of a particular system, the logic cards may include either driving components to operate as driver cards or receiving components to operate as receiver cards. It is an advantage of the invention that the position of either the driver cards or the receiver cards on the backplane may be free of any plug-in constraint, and that no slot is dedicated or reserved for any type of receiver or driver card. In fact, the electrical topology does not refer to physical slot identification since all electrical paths from the common point to the receiver cards and the driver card are equal.

Figure 2:
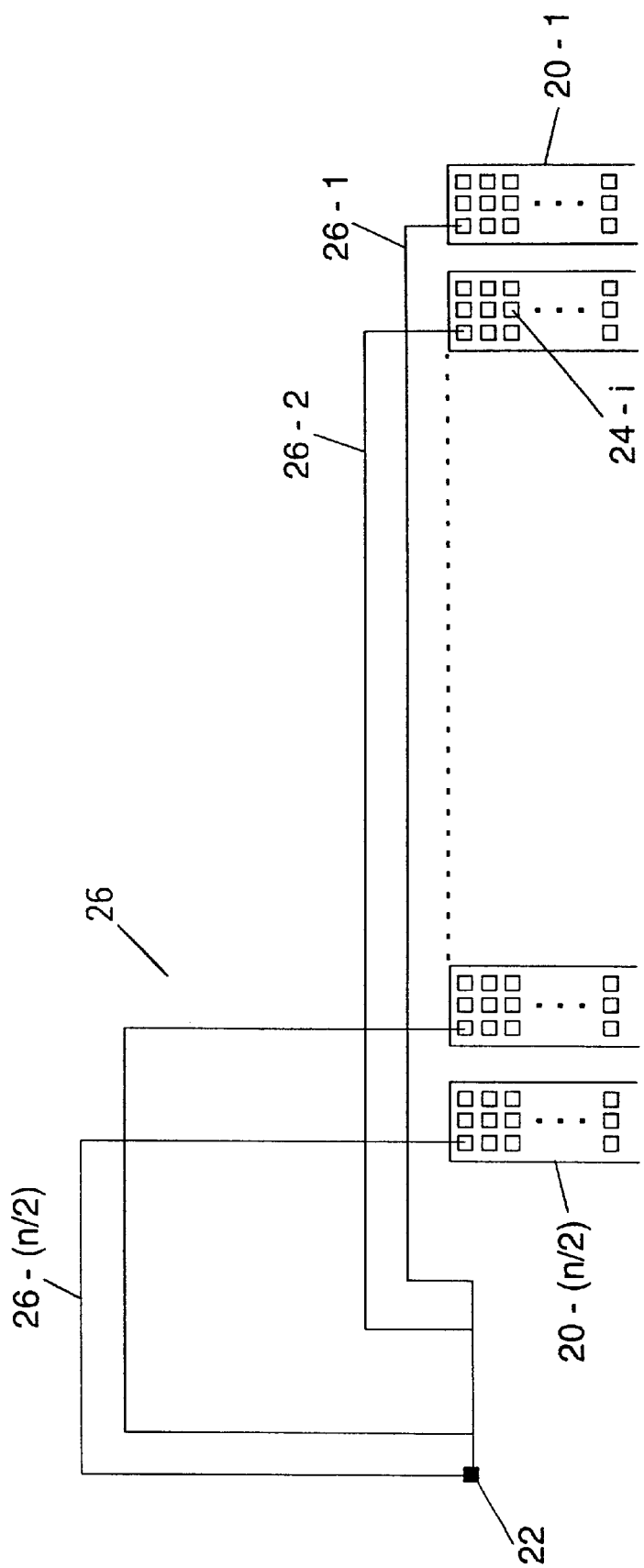
FIG. 2 depicts schematically a top view of one side of the distribution of the wires in accordance with the present invention.

FIG. 1 shows a schematical distribution of the electrical conductors or wires 16 in accordance with the present invention. The wires 16 provide a means by which electrical signals are delivered to the components of the logic cards through a corresponding pin of each connector. The electrical conductors 16 each terminate at an interconnected common point 18 which is preferably located in the middle zone of the backplane 10. As shown, the distribution of the electrical conductor is based on a multi-point wiring wherein the length of each individual conductor (16-1 to 16-n) which is calculated from the common point 18 to the destination pin is substantially the same. It is understood that various possible arrangements of the electrical conductors 16 allow an equal length for each conductor 16. FIG. 2 depicts a preferred implementation as now described.

Referring now to FIG. 2, a top view of a conductor distribution is shown. For sake of convenience, only one half of the complete distribution is shown, but those skilled in the art will readily understand that the distribution on the other half of the backplane may be symmetrical. A plurality of connectors (20-1 to 20-n/2) are linearly located on each half of the backplane assembly 10. Each connector 20-i may include a plurality of pins (24-i). A plurality of conductors (26-1) to (26-n/2) are interconnected at a common point 22 and distributed to a corresponding pin of an associated connector. For example, as shown on FIG. 2, each wire is attached to the upper left pin of each connector.

Preferably, each individual conductor is designed to represent a u-shape in order to easily allow a compensation of the distance of the connector to the common point. As shown, the u-shaped conductor (26-1) connected to the connector (20-1) which is the farthest from the common point 22 offers a base which is longer than the vertical sides of the 'u', whereas the u-shaped conductor (26-n/2) connected to the connector which is the closest to the common point may have a base shorter than the vertical sides of the 'u'. Theoretically, the vertical side 'V' of the 'u' represents a supplemental length which is calculated according to the following formula:

$$V = \frac{L\max - W}{2}$$

wherein Lmax is equal to the distance between the common point and the farthest connected pin, and W is equal to the distance between the common point and the closest connected pin.

As shown on FIG. 2, the vertical sides of the electrical conductors may cross the bases of several u-shaped conductors. Generally with the recent high speed technologies wherein the electrical conductors operate as high speed transmission lines, the printed circuit board is a multilayered printed circuit which allow such interconnections at different layers of electrical conductors.

The embodiment and example set forth herein were presented in order to best explain the present invention and its practical application and to thereby enable those skilled in the art to make and use the invention. However, those skilled in the art will recognize that the foregoing description and example have been presented for the purposes of illustration and example only. The description as set forth is not intended to be exhaustive or require the invention to be practiced the precise form disclosed. Many modifications or variations are possible in light of the above teaching without departing from the spirit and scope of the following claims. It is also possible to use some of the features of the present invention to advantage without the corresponding use of other features.

Having thus described the invention, what is claimed is:

1. Apparatus comprising:

a linear printed circuit board;

a plurality of connectors attached to said printed circuit board at spaced locations along the length of said printed circuit board, each of said connectors having a plurality of pins through which electrical signals are exchanged and receive logic cards inserted thereinto;

a common point disposed centrally of the length of said printed circuit board; and a plurality of electrical conductors formed on said circuit board and each extending between said common point and a corresponding one pin of a corresponding one connector, said plurality of electrical conductors having substantially equal lengths;

said common point and said electrical conductors cooperating to sustain synchronization of electrical signals passing between said common point and all of said pins.

2. Apparatus according to claim 1 wherein each of said plurality of electrical conductors are u-shaped and further wherein the dimensions of the base and legs of each u-shape is a function of the distance lengthwise of said circuit board between the common point and the connected pin of the corresponding connector.

3. Apparatus according to claim 1 wherein said electrical conductors define high speed transmission lines.

* * * * *